(12) United States Patent
Lai (10) Patent No.: US 8,327,201 B1
(45) Date of Patent: Dec. 4, 2012

(54) PARALLEL TESTING OF AN INTEGRATED CIRCUIT THAT INCLUDES MULTIPLE DIES

(75) Inventor: Andrew W. Lai, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 401 days.

(21) Appl. No.: 12/774,668

(22) Filed: May 5, 2010

(51) Int. Cl.
   *G01R 31/28* (2006.01)
(52) U.S. Cl. .......... 714/725; 714/732; 714/11; 714/742; 714/824; 326/16; 326/38; 326/39; 702/120; 324/762.03; 324/762.06
(58) Field of Classification Search .................. None
   See application file for complete search history.

(56) References Cited

U.S. PATENT DOCUMENTS

| 6,944,836 | B1 * | 9/2005 | Lai ................................. 716/136 |
| 8,063,654 | B2 * | 11/2011 | Rahman et al. .......... 324/762.03 |
| 8,072,234 | B2 * | 12/2011 | Fox ................................. 326/16 |
| 2002/0078412 | A1 * | 6/2002 | Wang et al. .................... 714/732 |
| 2005/0154552 | A1 * | 7/2005 | Stroud et al. .................. 702/120 |
| 2012/0126846 | A1 * | 5/2012 | Jong et al. ................ 324/762.03 |

OTHER PUBLICATIONS

U.S. Appl. No. 11/726,073, filed Mar. 21, 2007, Lai, Andrew, W. et al., Xilinx, Inc., 2100 Logic Drive, San Jose, CA USA.

\* cited by examiner

*Primary Examiner* — John Trimmings
(74) *Attorney, Agent, or Firm* — Kevin T. Cuenot (57) ABSTRACT

A method of testing an integrated circuit (IC) having a plurality of dies can include receiving, within a master die of the plurality of dies of the IC, a configuration data set specifying a circuit design, wherein the circuit design is instantiated within the master die. The method can include broadcasting the configuration data set to at least one slave die, wherein the circuit design is instantiated within each slave die and receiving, within the master die, a test vector set. The method also can include broadcasting the test vector set to the at least one slave die and responsive to each die executing the test vector set, storing test output data generated by each die.

20 Claims, 4 Drawing Sheets

PARALLEL TESTING OF AN INTEGRATED CIRCUIT THAT INCLUDES MULTIPLE DIES

FIELD OF THE INVENTION

One or more embodiments disclosed within this specification relate to semiconductor integrated circuits (ICs). More particularly, one or more embodiments relate to testing ICs that include multiple dies.

BACKGROUND

An integrated circuit ("IC"), such as a programmable IC, is a well-known type of IC that can be programmed to perform specified logic functions. One type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect and programmable logic circuits are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

As programmable ICs become larger and the number of devices within programmable ICs continues to grow, adequate testing the programmable ICs also becomes increasingly important. Testing a programmable IC typically entails loading configuration data within the programmable IC to instantiate a circuit design. Test vectors then can be loaded into the programmable IC and provided as input to the instantiated circuit design. The resulting, or actual, output data generated by execution of the test vectors by the programmable IC is compared with expected output data to determine whether any mismatches occur. A mismatch between the actual output data and the expected output data generally is indicative of a malfunction within the programmable IC.

SUMMARY

One or more embodiments disclosed within this specification relate to semiconductor integrated circuits (ICs) and, more particularly, to testing ICs that include multiple dies. One or more embodiments of the present invention can include a method of testing an IC having a plurality of dies. The method can include receiving, within a master die of the plurality of dies of the IC, a configuration data set specifying a circuit design, wherein the circuit design is instantiated within the master die, and broadcasting the configuration data set to at least one slave die. The circuit design can be instantiated within each slave die. The method can include receiving, within the master die, a test vector set, broadcasting the test vector set to the at least one slave die, and responsive to each die executing the test vector set, storing test output data generated by each die.

One or more embodiments of the present invention can include an IC that includes an interposer and a plurality of dies. The interposer can include a bus. The plurality of dies can include a master die and at least one slave die. Each die can be disposed on the interposer and can be coupled together via the bus. The master die can be configured to broadcast received test input data to the at least one slave die via the bus of the interposer.

One or more embodiments of the present invention can include an IC that includes an interposer and a plurality of dies. The plurality of dies can include a master die and a plurality of slave dies. Each die can be disposed on the interposer. The master die can be coupled to each of the plurality of slave dies via the interposer. The master die further can be configured to receive a configuration data set specifying a circuit design, and in response, instantiate the circuit design therein. The master die also can be configured to broadcast the configuration data set to the plurality of slave dies via the interposer thereby instantiating the circuit design within each slave die. In addition, the master die can be configured to receive a test vector set and, in response, broadcast the test vector set via the interposer to each slave die. Each slave die can be configured to execute the test vector set and store test output data within a memory disposed within each respective die.

DETAILED DESCRIPTION OF THE DRAWINGS

While the specification concludes with claims defining the features of one or more embodiments of the invention that are regarded as novel, it is believed that the one or more embodiments of the invention will be better understood from a consideration of the description in conjunction with the drawings. As required, one or more detailed embodiments of the present invention are disclosed herein; however, it is to be understood that the disclosed embodiment(s) are merely exemplary of the inventive arrangements, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of one or more embodiments of the invention.

One or more embodiments disclosed within this specification relate to semiconductor integrated circuits (ICs) and, more particularly, to testing ICs, such as programmable ICs, that include multiple dies. In the case of a programmable IC that includes multiple dies, each die within the programmable IC must be tested independently. Each die can be loaded with configuration data to instantiate a circuit design within that die independently of each other die. Test vectors then can be provided to each die and the actual output data generated from each die in response to execution of the test vectors can be compared with expected output data.

Some features of the programmable IC are common to each of the plurality of dies. Features found to be common to each of the plurality of dies can be tested in parallel. Parallel testing of the dies of the programmable IC, in general, entails loading a single configuration data set into the programmable IC. This single configuration data set, which specifies a circuit design, can be broadcast to each die within the programmable IC to instantiate the same circuit design within each die. Similarly, a single test vector set can be loaded into the programmable IC and then broadcast to each die.

The parallel testing techniques disclosed within this specification can reduce the time needed to test a multiple die programmable IC since one configuration data set and one corresponding test vector set can be loaded into the programmable IC to test features of multiple dies independently, but concurrently. Without segregating those features of the dies that are common from those that are not and utilizing the broadcast functionality described, multiple configuration data sets and test vector sets, e.g., at least one configuration data set and at least one test vector set for each die, would have to be loaded into the programmable IC for testing common features thereby requiring significantly more time for testing.

As used herein, the term "feature" can refer to one or more selected circuit elements of the dies of the programmable IC and/or the operation of those circuit elements. A feature can, therefore, be tested by configuring the die to implement a circuit that incorporates the selected circuit element(s), providing that circuit with input in the form of a test vector set, observing the resulting test output data, and comparing the test output data, i.e., actual output data, with expected test output data reflecting error free operation of the circuit. Differences between the actual test output data and the expected test output data indicate potential errors or malfunctions within the programmable IC.

Figure 1:
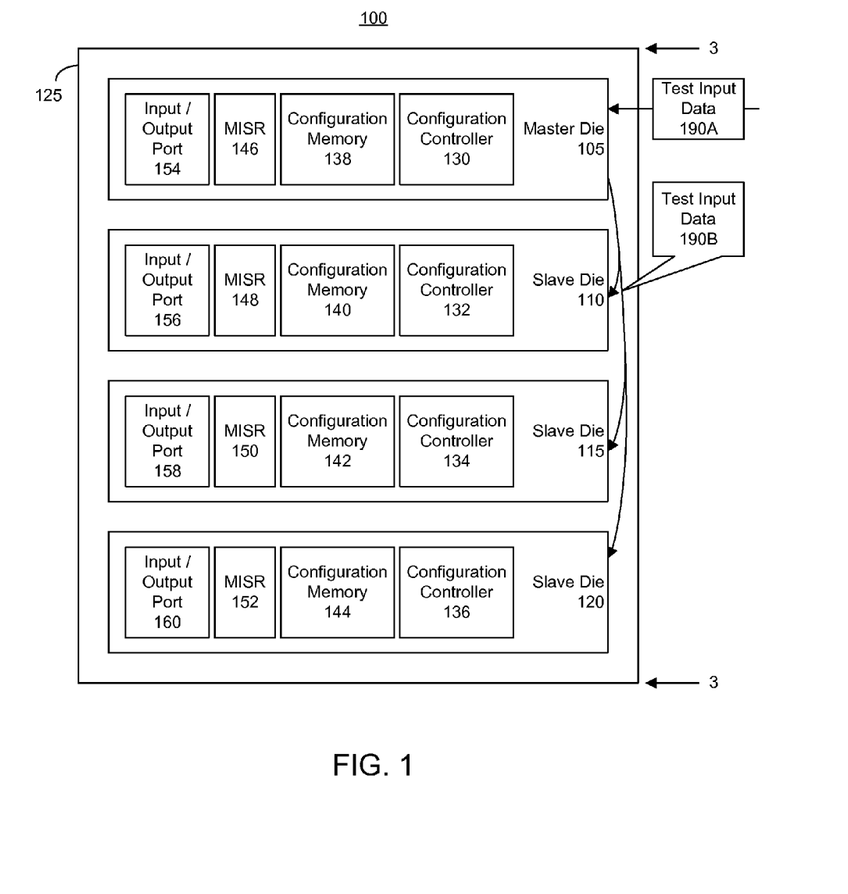
FIG. 1 is a first block diagram illustrating testing of a programmable integrated circuit (IC) having multiple dies in accordance with one embodiment of the present invention.

FIG. 1 is a first block diagram illustrating a testing technique for a programmable IC 100 having multiple dies in accordance with one embodiment of the present invention. As shown, programmable IC 100 includes a plurality of dies 105, 110, 115, and 120 disposed, or mounted, atop of an interposer 125. Interposer 125 can communicatively link dies 105-120 by coupling selected pins of different ones of dies 105-120 with one another, e.g., creating inter-die pin connections. By comparison, whereas a conventional programmable IC includes a single die within the IC packaging, programmable IC 100 includes a plurality of such dies.

For purposes of illustration, programmable IC 100 can implement a type of field programmable gate array (FPGA). An FPGA is used throughout this specification, by way of example, to better illustrate the various embodiments of the present invention. It should be appreciated, however, that one or more embodiments disclosed herein can be applied to other types of programmable ICs.

Within programmable IC 100, the dies 105-120 can generally correspond to a single conventional FPGA. In this regard, each of dies 105-120 can be loaded with configuration data causing that die to instantiate a particular circuit design. While each of dies 105-120 can be loaded with the same configuration data to instantiate the same circuit design, in another example, each of dies 105-120 can be loaded with different configuration data to instantiate a different circuit design that functions cooperatively with the circuit design within each other die to realize a larger circuit design or system formed of dies 105-120 collectively.

Interposer 125 can be implemented as a silicon die formed of one or more layers of an IC manufacturing process. In general, interposer 125 can include at least one metallization layer, but can include a plurality of metallization layers separated by appropriate insulating layers. The metallization layer, or layers as the case may be, implements signal lines, e.g., wires, that couple selected pins of each of dies 105-120. For example, interposer 125 can implement one or more buses through which dies 105-120 communicate with one another. In one embodiment, interposer 125 can be configured as an entirely passive structure within which the metallization layer(s) are disposed.

Within this specification, the same reference characters are used to refer to terminals, signal lines, wires, and their corresponding signals. In this regard, the terms "signal," "wire," "connection," "terminal," and "pin" may be used interchangeably, from time-to-time, within the this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

Dies 105-120 can include a master die 105 and a plurality of slave dies 110-120. For purposes of illustration, three slave dies are shown. The one or more embodiments described within this specification, however, are not intended to be limited by the particular number of dies disposed upon interposer 125. For example, in addition to master die 105, programmable IC 100 can be configured to include a single slave die or more than three slave dies.

As shown, each of dies 105-120 can include a configuration controller 130, 132, 134, and 136 respectively. Each of configuration controllers 130-136 is configured to receive a configuration data set, process the configuration data set, and store the configuration data set in appropriate cells of configuration memory within each respective one of dies 105-120. Storing a configuration data set within appropriate configuration memory of a die effectively instantiates the circuit design specified by the configuration data set within that die.

Within this specification, the phrase "configuration data set" is used to refer to configuration data that specifies a circuit design for implementation within a single die of programmable IC 100. In general, from a user point of view and apart from the testing described herein, programmable IC 100 can be configured with configuration data that includes a plurality of configuration data sets, e.g., one for each die. From a user point of view, that configuration data can look or appear as a single configuration data set. For purposes of testing and description within this specification, however, a configuration data set refers to the configuration data for instantiating a circuit within a single die unless otherwise noted.

Each of dies 105-120 can include a plurality of configuration memories 138, 140, 142, and 144 respectively. As noted, loading a configuration data set within the configuration memory of a die instantiates a circuit design within that die. Thus, a configuration data set received within master die 105 can be loaded into configuration memory 138 via configuration controller 130. A configuration data set received within slave die 110 can be loaded into configuration memory 140 via configuration controller 132. A configuration data set received within slave die 115 can be loaded into configuration memory 142 via configuration controller 134. A configuration data set received within slave die 120 can be loaded into configuration memory 144 via configuration controller 136.

Each of dies 105-120 also can include a multiple input signature register (MISR) 146, 148, 150, and 152 respectively. An MISR is a well-known type of circuit. Different types of MISRs exist and any of a variety of the different types of MISRs can be used within one or more of the embodiments described within this specification. In general, each one of MISRs 146-152 can include a series of memory circuits, such as flip-flops, alternating with XOR circuits. Each flip-flop is reset by a reset signal and clocked by a clock signal. Each XOR circuit element is driven by an output terminal of the die, e.g., an output of the circuit design instantiated within the die in consequence of loading configuration data into the configuration memory of the die. Thus, each of MISRs 146-152 can receive one or more outputs from a circuit and generate a signature that is stored within the MISR based upon the received circuit outputs. The signature subsequently can be output from the MISR for analysis. A more detailed example of an MISR is provided with reference to FIG. 2.

Although FIG. 1 illustrates one MISR disposed within each of dies 105-120, in one or more embodiments, each of dies 105-120 can include a plurality of MISRs. For example, each of the plurality of MISRs of a die can be associated with a selected group of output terminals or inputs/outputs (I/Os) of the die. Typically, each MISR is associated with a group of output terminals or I/Os that are within a single bank, though this need not be the case. Accordingly, it should be appreciated that reference to any of MISRs 146-152 individually can refer to a plurality of MISRs, where each MISR is associated with a unique set of output terminals and/or I/Os of the die.

Each of dies 105-120 also can include an I/O port 154, 156, 158, and 160 respectively. I/O ports 154-160 can output the signatures generated and stored within each of MISRs 146-152 respectively. Signatures output from I/O ports 154-160 can be passed through to external pins of programmable IC 100 coupled to interposer 125 to one or more other systems or computing devices external to programmable IC 100 for purposes of analyzing the signatures. For example, I/O ports 154-160 can be implemented in accordance with the IEEE 1149 JTAG protocol. Still, any of a variety of different types of I/O port configurations or protocols can be used. As such, JTAG is provided as one non-limiting example. As used herein, "outputting" and/or "output" can mean, for example, writing to a file, writing to a user display or other output device, storing in memory, sending or transmitting to another system, exporting, or the like.

In operation, test input data 190A can be loaded into programmable IC 100. Test input data 190A can include a configuration data set specifying a circuit design and/or one or more test vectors forming a test vector set. As pictured in FIG. 1, test input data 190A can be received within master die 105. Master die 105 can be configured to broadcast test input data 190 to slave dies 110-120. For purposes of illustration, the test input data received by master die 105 at a time $t_1$ is labeled test input data 190A. Test input data 190B can be the same as, e.g., identical to, test input data 190A. Test input data 190B denotes that the test input data is being broadcast from master die 105 to slave dies 110-120 at a time $t_2$ that likely is subsequent to time $t_1$, e.g., after some small internal propagation delay.

FIG. 1 illustrates that test input data 190 (in reference to both test input data 190A and 190B), which can include a configuration data set and/or a test vector set, can be received by master die 105 and broadcast to each of slave dies 110-120. For example, a configuration data set can be loaded into master die 105 and broadcast to each of dies 110-120 to instantiate a circuit design, i.e., a same circuit design, within each of dies 105-120. Thus, the programmable fabric of each of dies 105-120 implements the same circuit design.

After configuration, a test vector set loaded into master die 105 can be broadcast to each of slave dies 110-120 for execution. Each of dies 105-120 can receive the test vector set. The test vector set is provided to inputs of the circuit instantiated within each respective one of dies 105-120. Within each of dies 105-120, the circuits execute the test vectors, i.e., the same test vector set. Test output data resulting from execution of the test vector set within each of dies 105-120 can be accumulated and/or stored in the form of signatures within each of MISRs 146-152 for each respective one of dies 105-120. Subsequently, the test output data can be read out of, or output from, each one of dies 105-120 via I/O ports 154-160 respectively.

By broadcasting the test input data throughout programmable IC 100 to the various dies, the need to load multiple copies of a given configuration data set and a given test vector set, e.g., one copy for each die, into programmable IC 100 is eliminated. Accordingly, for purposes of testing particular features that are common or shared between each of dies 105-120, only one configuration data set and one test vector set can be loaded into master die 105 and broadcast to each of slave dies 110-120. Were broadcasting, as described, not used, a larger amount of configuration data would be loaded into the programmable IC that effectively includes one configuration data set and one test vector set for each die. Thus, the use of broadcasting reduces the test input data 190 required for testing common features by approximately 75%.

It should be appreciated that the order in which the various dies are illustrated upon interposer 125 is not intended as a limitation. For example, master die 105 can be disposed between two slave dies or moved to the location of die 120 without limitation.

Figure 2:
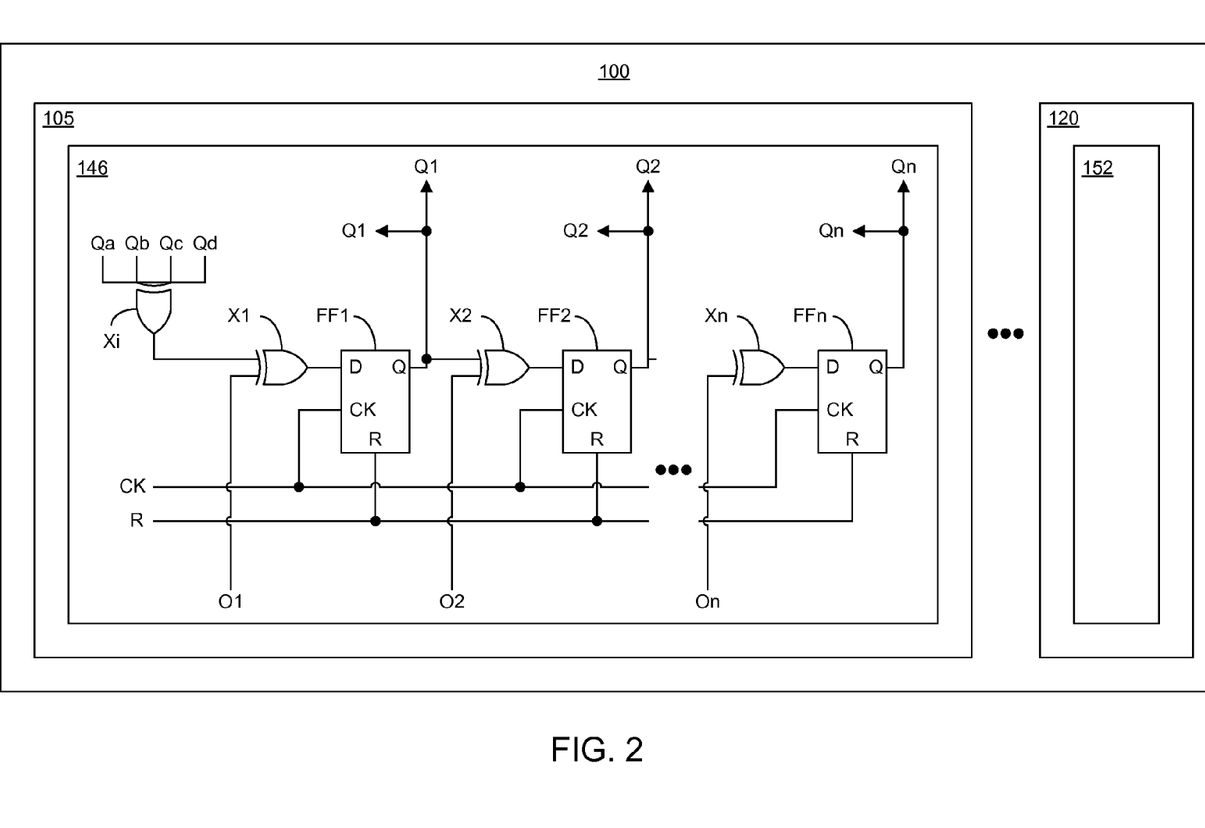
FIG. 2 is a second block diagram illustrating an example of a multiple input signature register in accordance with another embodiment of the present invention.

FIG. 2 is a block diagram illustrating an MISR in accordance with another embodiment of the present invention. FIG. 2 is intended to provide an example of an MISR. As such, selected elements of programmable IC 100 have been excluded for purposes of illustration. Further, the various elements shown in FIG. 2 are not drawn to scale.

As noted, FIG. 2 shows one possible implementation of an MISR such as MISR 146 within master die 105. As shown, MISR 146 includes a series of memory elements (e.g., flip-flops) FF1-FFn alternating with XOR elements X1-Xn. Each of flip-flops FF1-FFn is reset by a reset signal denoted as "R" that can be generated within, or provided to, programmable IC 100. Each of flip-flops FF1-FFn is clocked by a clock signal denoted as "CK" that also can be generated within, or provided to, programmable IC 100.

Each XOR element X1-Xn is driven by an associated output terminal O1-On. Output terminals O1-On represent outputs of the circuit design instantiated within master die 105 that is undergoing testing. For example, responsive to a test vector set being provided to the circuit design and executed, output test data on output terminals O1-On can be captured as a signature by MISR 146. Each XOR element X1-Xn is also driven by the registered output signal denoted as "Q" from a preceding memory element. Each XOR element X1-Xn drives the data input terminal denoted as "D" of a subsequent memory element FF1-FFn in the series. An initial XOR element Xi drives the first XOR element X1 in the series. XOR element Xi is driven by output terminals of selected ones of the memory elements. In some embodiments, XOR element Xi has four input terminals. In other embodiments (not shown), XOR element Xi has some other number of input terminals.

Within FIG. 2, "n" can represent an integer that specifies the number of memory elements within MISR 146. The number n further can be the same as the number of output terminals O1-On of the circuit design instantiated within master die 105 to be monitored as part of the test output data. The selection of MISR taps (i.e., which memory element outputs Q1-Qn are fed back to initial XOR element Xi shown as Qa, Qb, Qc, and Qd) can be made, for example, to maximize sensitivity to output errors and to minimize aliasing. For instance, the value of n can be 16 and the selected taps can be Q3, Q7, Q10, and Q16. In another embodiment, the value of n can be 32 and the selected taps can be Q7, Q19, Q26, and Q32. In yet another embodiment, the value of n can be 48 and the selected taps can be Q19, Q29, Q38, and Q48.

The signature determined by MISR 146 can be stored within another memory, output to a scan chain, output via an output port directly to a tester, or the like. It should be appreciated that MISR 146 illustrated in FIG. 2 is provided for purposes of illustration only and is not intended to limit the one or more embodiments disclosed within this specification. Though dies 110 and 115 are not shown, FIG. 2 illustrates that each of dies 105-120 can include an MISR configured as described with reference to MISR 146.

Figure 3:
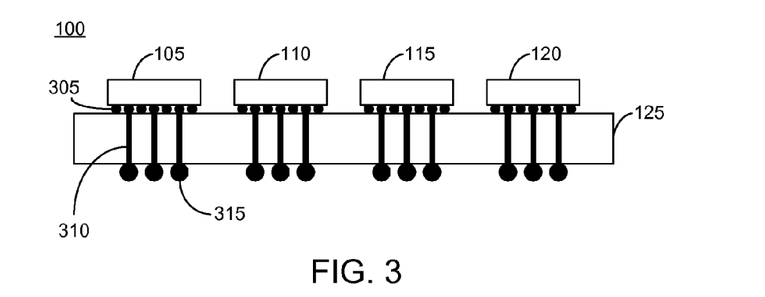
FIG. 3 is a first cross-sectional side view of the programmable IC of FIG. 1 in accordance with another embodiment of the present invention.

FIG. 3 is a first cross-sectional side view of programmable IC 100 of FIG. 1 in accordance with another embodiment of the present invention. As pictured in FIG. 3, each of dies 105-120 is coupled to interposer 125 through a plurality of micro bumps 305. Micro bumps 305 are generally solder balls that electrically couple pins of each of dies 105-120 to various signal lines, or pads, on interposer 125.

Interposer 125 includes a plurality of Through Silicon Vias (TSVs) 310. Each TSV 310 extends completely through interposer 125 extending from the top surface through to the bottom surface. Each TSV 310 can couple a pin of one of dies 105-120, via a micro bump 305, for example, to one of the plurality of package bumps 315. Package bumps 315, also referred to as "C4 bumps," are solder balls that couple interposer 125 to the package of programmable IC 100, and thus, to external pins of the package.

In one or more embodiments, selected pins of master die 105 can be coupled to external pins of programmable IC 100 via micro bumps 305 connecting to TSVs 310, which in turn connect to package bumps 315. One or more of these selected pins can be used to implement a port that can be dedicated to, for example, configuration and/or testing of programmable IC 100. Thus, through the port, master die 105 and one or more of slave dies 110-120 can be configured and/or tested as described within this specification. Similarly, selected pins of slave dies 110-120 can be coupled to external pins of programmable IC 100 via micro bumps 305 connecting to TSVs 310, which in turn connect to package bumps 315. The various ways of coupling dies 105-120 to interposer 125 and interposer 125 to the packaging of programmable IC 100, e.g., the various bumps described, are provided for purposes of illustration only and are not intended to limit the one or more embodiments described within this specification.

Figure 4:
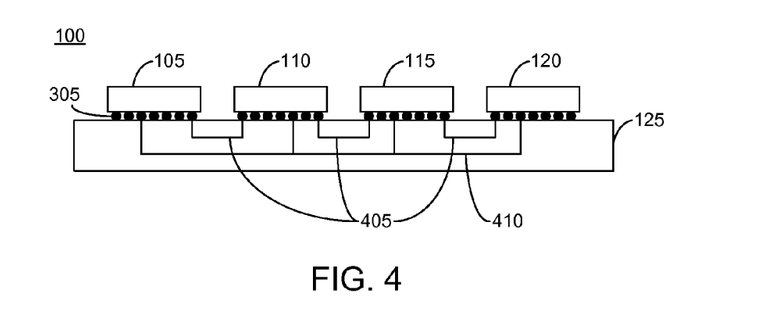
FIG. 4 is a second cross-sectional side view of the programmable IC of FIG. 1 in accordance with another embodiment of the present invention.

FIG. 4 is a second cross-sectional side view of programmable IC 100 of FIG. 1 in accordance with another embodiment of the present invention. For purposes of illustration, TSVs 310 and package bumps 315 are not shown. FIG. 4 illustrates several examples of connectivity between dies 105-120 that can be implemented within interposer 125. Though not illustrated in detail, it should be appreciated that horizontal portions of signal lines 405 and 410 illustrated in FIG. 4 can be implemented using metallization layers. Vertical portions of signal lines 405 and 410 can be implemented using one or more vias that extend vertically through one or more layers of interposer 125. Vias of signal lines 405 and 410, unlike TSVs 310, do not extend completely through interposer 125. The vias illustrated with respect to signal lines 405 and 410, for example, extend up through to the top surface of interposer 125, but do not extend down through to the bottom surface of interposer 125.

Signal lines 405 illustrate that selected ones of dies 105-120 can directly couple to other ones of dies 105-120. For example, through signal lines 405, selected pins of master die 105 can be directly coupled to selected pins of slave die 110. Similarly, selected pins of slave die 110 can be directly coupled to selected pins of slave die 115. Finally, selected pins of slave die 115 can be directly coupled to selected pins of slave die 120.

In one or more embodiments, data can be broadcast among dies 105-120 via signal lines 405. For example, data can be sent in a daisy chain fashion from one die to the next, e.g., from master die 105 to slave die 110, from slave die 110 to slave die 115, and then to slave die 120. In one aspect, data can be received within a die, stored if necessary, and also allowed to pass through the die quickly by coupling one or more input pins of the die directly to one or more output pins of the die via intra-die connections. Alternatively, data sent in daisy chain fashion can be routed through internal processing within one or more of dies 105-120 prior to being passed on to the next die in the series or chain.

Signal lines 410 illustrate a bus that can be implemented within interposer 125. Though only one such bus is illustrated, it should be appreciated that a plurality of buses can be formed within interposer 125 and that each bus can be used or dedicated for a particular purpose such as configuration, testing, user logic, etc. Thus, data received by one die such as master die 105 through one or more TSVs (not shown) can be broadcast, e.g., sent, to one or more of slave dies 110-120 via signal lines 410 implementing a bus. Broadcasting data via signal lines 410 allows master die 105 to send data to one or more or all of slave dies 110-120 simultaneously or concurrently.

Within conventional programmable ICs that include a single die, various compression techniques are available for reducing the amount of time needed to load a configuration data set within the programmable IC. One technique is called "multi-frame write." A "frame" of configuration data generally refers to the smallest unit of configuration data that can be written to configuration memory. Multi-frame write refers to the situation in which two or more frames of a configuration data set are identical. In such situations, rather than loading multiple, identical frames of configuration data into a programmable IC, the frame can be loaded one time with an instruction indicating how many times that frame is to be written into configuration memory. The multi-frame write technique also can be used for larger segments of configuration memory such as, for example, when two or more entire columns of programmable circuitry of the conventional programmable IC are configured identically. Thus, a number of frames can be loaded into the programmable IC one time and written multiple times as a single larger unit to configuration memory.

Another technique is called "skip write zero." Skip write zero refers to the situation in which cells of configuration memory that are to be loaded with the value "0" can be skipped, e.g., not written to, during configuration. Skip write zero leverages the fact that the initialized or default value of a cell of configuration memory is zero. Techniques such as multi-frame write and skip write zero, among others, reduce the number of register writes required when a configuration data set is loaded into a programmable IC.

Within a multiple die programmable IC, however, these types of compression techniques do not span across multiple dies. When loading a user circuit design within programmable IC 100, for example, configuration data for programmable IC 100 typically specifies a different circuit design to be instantiated within each die. This means that the configuration data set for each die differs from each other die within programmable IC 100. While the compression techniques described can be applied to the configuration data for a particular die, or on a per die basis, the techniques cannot be applied across each die of programmable IC 100 since each die has a configuration controller. For example, a particular frame written to each of dies 105-120 of programmable IC 100 appears within the configuration data for programmable 10100 at last four times, e.g., one time for each of dies 105-120. Multi-frame write can be applied to that frame to repeat the frame within a same die, but cannot be applied across dies 105-120.

In accordance with one or more embodiments of the present invention, because each die is loaded with the same set of configuration data, the aforementioned compression techniques can be used to effectively span multiple dies resulting in greater compression. The different techniques can be applied to the configuration data since each die receives the exact same configuration data set. Despite each die having a configuration controller that is independent of the configuration controller of each other die, each configuration controller can correctly decode or uncompress the broadcast configuration data set. Thus, referring to the prior example where a frame is to be loaded into each of dies 105-120, there is only one instance of that frame within the configuration data for programmable IC 100 rather than one instance per die.

Figure 5:
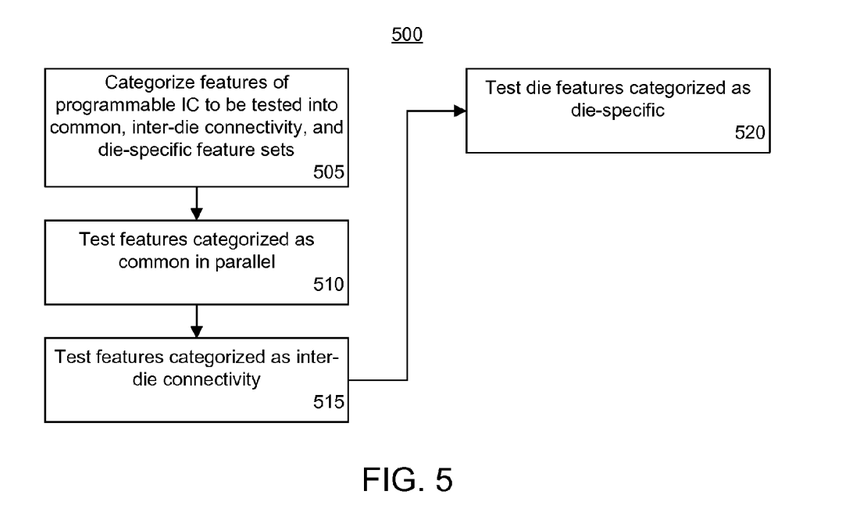
FIG. 5 is a first flow chart illustrating a method of testing a programmable IC having multiple dies in accordance with another embodiment of the present invention.

FIG. 5 is a first flow chart illustrating a method 500 of testing a programmable IC having multiple dies in accordance with another embodiment of the present invention. Method 500 illustrates how the identification of features common across multiple dies of the programmable IC can be leveraged to reduce the time required for testing.

Method 500 can begin in step 505, where features of the programmable IC to be tested can be categorized into different sets. For example, features that are common to each die can be categorized as "common." Features that relate to interconnectivity of dies, e.g., how one die communicates with another die via the interposer, can be categorized as "inter-die connectivity." Features that are specific to one or more particular dies, but not to all dies, can be categorized as "die-specific."

As noted, a feature refers to one or more selected circuit elements and the operation of those circuit elements. Accordingly, a feature can be tested by configuring the die to implement a circuit, providing that circuit with input in the form of a test vector set, observing the resulting test output data, and comparing the test output data, i.e., actual output data, with expected test output data reflecting error free operation of the circuit. Differences between the actual test output data and the expected test output data indicate potential errors or malfunctions within the programmable IC.

Examples of common features can include circuits, systems, or devices that exist within each die of the programmable IC. Portions of user-configurable circuitry such as configurable logic blocks, I/O circuits, multiplexers, etc. likely exist in similar, if not the same, arrangement within each die of the programmable IC. In such cases, each die can be configured to implement a same circuit design utilizing those common features. Rather than load the same configuration data set specifying the same circuit design into the programmable IC multiple times, e.g., one time for each die, the configuration data set specifying a circuit design for a single die can be loaded into the programmable IC one time and broadcast to other dies. The same can be true of test vectors provided to each die once configured with the same circuit design. Thus, the time needed to test for common features can be reduced through the reduction in the amount of configuration data and number of test vectors that need to be loaded into the programmable IC.

Examples of inter-die connectivity features relate to testing connections between dies. This can include, for instance, testing connectivity between each die and the interposer, testing signal lines that couple selected pins of selected dies, and the like. Inter-die connectivity features are unlikely to be shared among dies since only particular pins may be configured for inter-die communication and these pins may or may not be the same from one die to another.

Examples of die-specific features can include functionality of one die that is not included or replicated in another die. Some circuit components or systems can be made available on a particular die, but not on others. For example, a processor may be disposed on a first die but not on a second die, leaving the second die available to implement other specialized circuits. In another example, circuitry for broadcasting test data can differ from master die to slave dies in that the master die is configured to broadcast test data whereas the slave dies are configured primarily to receive broadcast test data. One die may include a multi-gigabit transceiver while another die includes a different type of transceiver, etc.

Thus, in step 510, the features categorized as common features can be tested in parallel. Step 510 is described in greater detail with reference to FIG. 6. In step 515, the features categorized as inter-die connectivity can be tested. In step 520, die-specific features can be tested. Testing described in steps 515 and 520 is not performed in parallel. Rather, the testing implemented in steps 515 and 520 typically entails loading a first configuration data set within a first die, loading a second and different configuration data set within a second die, etc. of the programmable IC. The dies can be tested by providing test vector sets as input, observing actual test output data, and comparing that test output data to expected test output data. In some cases, testing specific features requires that multiple dies be tested concurrently or in a cooperative manner though each implements a different circuit design. In other cases, however, testing for specific features requires that the dies be tested individually.

Test vectors are handled similar to the configuration data sets for steps 515 and 510. More particularly, testing inter-die connectivity features and die-specific features can include not only loading different configuration data sets into each die to instantiate different circuits that are tested cooperatively (concurrently) or individually, but also supplying different test vector sets to each die as part of the test.

Figure 6:
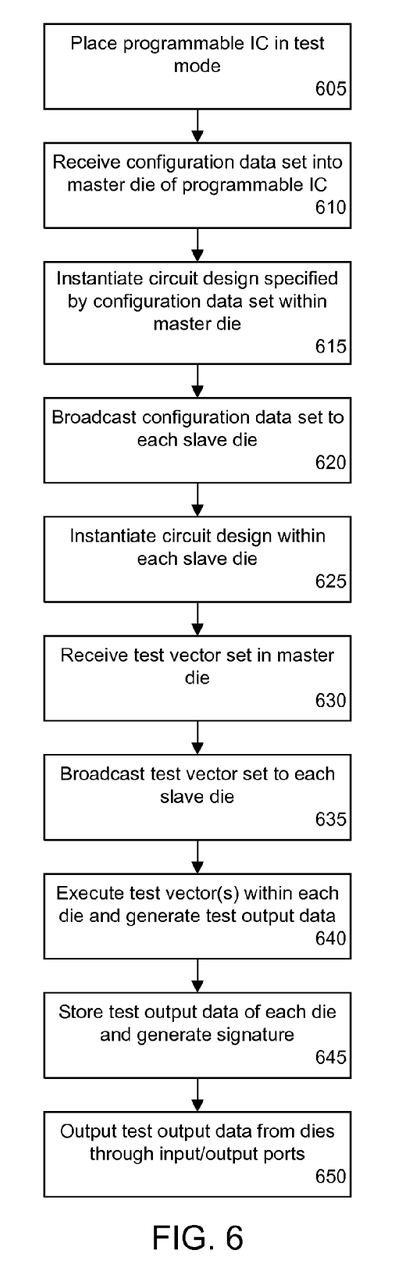
FIG. 6 is a second flow chart illustrating a method of testing a programmable IC having multiple dies in accordance with another embodiment of the present invention.

FIG. 6 is a second flow chart illustrating a method of testing a programmable IC having multiple dies in accordance with another embodiment of the present invention. FIG. 6 illustrates a parallel technique for testing features of a programmable IC having multiple dies that have been categorized as common. For example, FIG. 6 illustrates one technique for performing step 510 of FIG. 5. FIG. 6 can be performed automatically using test equipment capable of providing test input data to a programmable IC under test, reading test output data from the programmable IC, and comparing the test output data with expected test output data. Those skilled in the art will appreciated that any of a variety of different test systems can be utilized and configured to operate as described with reference to FIG. 6.

In step 605, the programmable IC can be placed into a test mode that enables a broadcast function from the master die to each of the slave dies. The broadcast function allows each die to be configured using the same configuration data set. In this test mode, test input data that is received can be broadcast from the master die to each slave die of the programmable IC. In step 610, a configuration data set can be received. For example, the configuration data set can be received via selected pins, e.g., dedicated configuration pins, of the package of the programmable IC. The configuration data set, when received through the dedicated pins, can be provided to the master die. As described, the configuration data set specifies a circuit design such as a test circuit design.

In step 615, the circuit design specified by the configuration data set can be instantiated within the master die. More particularly, the configuration controller within the master die receives the configuration data set and stores the configuration data set within the appropriate cells of configuration memory of the master die thereby instantiating the circuit design within the master die. In step 620, the master die can broadcast the configuration data set to each slave die within the programmable IC. The configuration data can be broadcast to each slave die via a bus reserved for configuration functions disposed within the interposer. In another embodiment, the configuration data can be broadcast through daisy chaining as described with reference to signal lines 405 of FIG. 4.

It should be appreciated that while step 615 is illustrated as occurring prior to step 620, that steps 615 and 620, like other steps to be described with respect to FIG. 6, can be performed concurrently. For example, while the configuration data set is received within the master die and the configuration controller within the master die instantiates the circuit design within the master die, the master die also can be broadcasting the configuration data set to the slave dies. When broadcast via the bus, the configuration data set is sent simultaneously to each slave die. When sent via daisy chain, the configuration data set arrives at each slave die slightly after having arrived at the prior die, e.g., after a slight propagation delay.

In any case, in step 625, the configuration controller within each slave die can load the configuration data set received from the master die into the appropriate cells of the configuration memory of each respective slave die. As noted, the act of loading the configuration data set into configuration memory of a die instantiates the circuit design within that die. Thus, responsive to receiving the broadcast configuration data set, each die of the programmable IC is configured with the same circuit design.

In step 630, a test vector set can be received. For example, the test vector set can be received via the dedicated configuration pins of the programmable IC package. The test vector set, when received through the dedicated pins, can be provided to the master die. In step 635, the test vector set can be broadcast to each slave die of the programmable IC. Because each die of the programmable IC is configured with the same circuit design, the same test vector set can be used to test the common features of each die. While each die within the programmable IC is configured with the same circuit design, each die may not be coupled to the package of the programmable IC in the same way. Thus, the test vector set can be sent to each slave die, e.g., broadcast to each slave die, via the dedicated configuration pins coupled to the configuration bus within the interposer or by daisy chaining as described.

In step 640, the test vector(s) of the test vector set can be executed within each die, i.e., within the master die and each slave die. Executing the test vector set refers to the process of providing the test vector set as stimulus to the appropriate inputs of each die and observing the resulting test output data generated in consequence of the circuits acting upon, or responding to, the provided stimulus. In step 645, the test output data from each die can be stored and used to generate a signature for each respective die. For example, the test data output from each die can be provided to the MISR within that die. As illustrated with reference to FIG. 2, providing the output data to an MISR effectively causes the MISR generate a signature that is stored within the MISR. Thus, within each die, the MISR of the die effectively transforms the format of the test output data from one of raw output signals to one of a signature that is stored within the MISR or another suitable memory coupled to the MISR. Each signature is, therefore, die specific.

In step 650, the test output data stored in each die, e.g., the signature stored within the MISR or other memory of that die, can be output via the I/O port of the die. For example, the signature from each MISR can be output from each die via the JTAG port of that die or another I/O port. In one embodiment, the I/O port of each die can be coupled to external pins of the programmable IC so that the test output data from each die can be output directly to an external system. In another embodiment, the I/O port of each die can be processed within programmable IC 100, e.g., within the master die, and output collectively through a single I/O port of the programmable IC that is not die-specific. Signatures output from the programmable IC can be compared with expected signatures to determine whether any mismatches exist that are indicative of a malfunction or other error condition within one of the dies.

When output from different I/O ports of the programmable IC, each signature can be identified according to the particular output pins through which the data is read. In other situations, the signatures can be read from the programmable IC in a particular or predetermined order such that a mismatch between a particular signature and the expected signature can be correlated to a particular die of the programmable IC. Still, in another example, identifiers can be placed into the signature to indicate the particular die that generated the signature.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

One or more embodiments of the present invention can be realized in hardware or a combination of hardware and software. The embodiments can be realized in a centralized fashion in one system or in a distributed fashion where different elements are spread across several interconnected systems. Any kind of data processing system or other apparatus adapted for carrying out at least a portion of the methods described herein is suited.

One or more embodiments of the present invention further can be embedded in a device such as a computer program product, which comprises all the features enabling the implementation of the methods described herein. The device can include a data storage medium, e.g., a computer-usable or computer-readable medium, storing program code that, when loaded and executed in a system comprising memory and a processor, causes the system to perform at least a portion of the functions described herein. Examples of data storage media can include, but are not limited to, optical media, magnetic media, magneto-optical media, computer memory such as random access memory or hard disk(s), or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed herein can be embodied in other forms without departing from the spirit or essential attributes thereof. Accordingly, reference should be made to the following claims, rather than to the foregoing specification, as indicating the scope of the embodiments of the present invention.

What is claimed is:

1. A method of testing an integrated circuit (IC) comprising a plurality of dies, the method comprising:
   receiving, within a master die of the plurality of dies of the IC, a configuration data set specifying a circuit design, wherein the circuit design is instantiated within the master die;
   broadcasting the configuration data set to at least one slave die, wherein the circuit design is instantiated within each slave die;
   receiving, within the master die, a test vector set;
   broadcasting the test vector set to the at least one slave die; and
   responsive to each die executing the test vector set, storing test output data generated by each die.

2. The method of claim 1, wherein the at least one slave die comprises a plurality of slave dies, wherein broadcasting the configuration data set further comprises:
   sending the configuration data set from the master die to the plurality of slave dies simultaneously.

3. The method of claim 1, wherein broadcasting the configuration data set further comprises:
   sending the configuration data set from the master die to the at least one slave die through a bus disposed within an interposer of the IC.

4. The method of claim 3, wherein the bus of the interposer is dedicated for configuration functions and is not available for user circuit designs.

5. The method of claim 1, wherein the at least one slave die comprises a plurality of slave dies, wherein broadcasting the test vector set further comprises:
   sending the test vector set from the master die to the plurality of slave dies simultaneously.

6. The method of claim 1, wherein broadcasting the test vector set further comprises:
   sending the test vector set from the master die to the at least one slave die through a bus disposed within an interposer of the IC.

7. The method of claim 1, wherein storing test output data generated by each die further comprises, within each die:
   storing the test output data generated by that die within a memory disposed within the die; and
   outputting the test output data stored within the memory through an output port of the die.

8. The method of claim 1, wherein storing test output data generated by each die further comprises, within each die:
   generating a signature of the test output data using a multiple input signature register; and
   outputting the signature through an output port of the die.

9. An integrated circuit (IC) comprising:
   an interposer comprising a bus; and a plurality of dies comprising a master die and at least one slave die, wherein each die is disposed on the interposer and is coupled together via the bus, wherein the master die is configured to broadcast received test input data to the at least one slave die via the bus of the interposer.

10. The IC of claim 9, wherein the at least one slave die comprises a plurality of slave dies, wherein the master die is configured to broadcast the test input data to each of the plurality of slave dies simultaneously.

11. The IC of claim 9, wherein, responsive to receiving the test input data comprising a configuration data set that specifies a circuit design, the master die is configured to instantiate the circuit design and send the configuration data set to each slave die.

12. The IC of claim 11, wherein the master die is configured to send the configuration data set to each slave die through the bus.

13. The IC of claim 11, wherein responsive to receiving the configuration data set, each slave die is configured to instantiate the circuit design.

14. The IC of claim 12, wherein, responsive to receiving the test input data comprising a test vector set, the master die is configured to send the test vector set to each slave die.

15. The IC of claim 14, wherein each die of the plurality of dies is configured to execute the test vector set and store test output data generated responsive to execution of the test vector set.

16. The IC of claim 15, wherein each die of the plurality of dies comprises a multiple input signature register, wherein, for each die, the multiple input signature register generates a signature representing the test output data of the die.

17. An integrated circuit (IC) comprising:
an interposer; and
a plurality of dies comprising a master die and a plurality of slave dies, wherein each die is disposed on the interposer and the master die is coupled to each of the plurality of slave dies via the interposer, wherein the master die is configured to receive a configuration data set specifying a circuit design, and in response, instantiate the circuit design therein and broadcast the configuration data set to the plurality of slave dies via the interposer thereby instantiating the circuit design within each slave die;

wherein the master die is configured to receive a test vector set and, in response, broadcast the test vector set via the interposer to each slave die, wherein each die is configured to execute the test vector set and store test output data within a memory disposed within each respective die.

18. The IC of claim 17, wherein the interposer comprises a bus, and wherein the master die is configured to broadcast the configuration data set to each of the plurality of slave dies simultaneously over the bus of the interposer.

19. The IC of claim 17, wherein the interposer comprises a bus, and wherein the master die is configured to broadcast the test vector set to each of the plurality of slave dies simultaneously over the bus of the interposer.

20. The IC of claim 17, wherein each die of the plurality of dies comprises a multiple input signature register, wherein, for each die, the multiple input signature register is configured to generate a signature representing the test output data of the die.

\* \* \* \* \*